United States Patent [19]
Jordan

[11] 4,451,903
[45] May 29, 1984

[54] METHOD AND DEVICE FOR ENCODING PRODUCT AND PROGRAMMING INFORMATION IN SEMICONDUCTORS

[75] Inventor: Larry T. Jordan, Pleasanton, Calif.
[73] Assignee: Seeq Technology, Inc., San Jose, Calif.
[21] Appl. No.: 303,374
[22] Filed: Sep. 18, 1981

Related U.S. Application Data

[63] Continuation-in-part of Ser. No. 301,592, Sep. 14, 1981, abandoned.
[51] Int. Cl.$^3$ .............................................. G11C 17/00
[52] U.S. Cl. ...................................... 365/94; 235/492; 365/201
[58] Field of Search .................. 365/94, 96, 103, 201; 235/380, 381, 382, 487, 492

[56] References Cited

U.S. PATENT DOCUMENTS

| | | | |
|---|---|---|---|
| 3,712,537 | 1/1973 | Carita | 365/201 |
| 3,872,452 | 3/1975 | Stoops | 365/94 |
| 4,344,155 | 8/1982 | Mollier | 365/201 |

OTHER PUBLICATIONS

Wahler, "Using Fusible Links to Apply Machine-Readable Serial Numbers to Printed-Circuit Boards," *IBM Tech. Disc. Bul.*, vol. 20, No. 6, 11/77, p. 2286.

*Primary Examiner*—Stuart N. Hecker
*Attorney, Agent, or Firm*—Lyon & Lyon

[57] ABSTRACT

A method and system for encoding key product information in semiconductors is disclosed. The invention is particularly useful in connection with byte-wide memories, but also finds application in a wide range of semiconductor devices. A plurality of read only memory cells are juxtaposed on a semiconductor die with the circuitry which performs the primary function of the chip. The read only memory cells are interconnected with the primary circuit in such a manner that the information stored therein can be accessed only when such access does not interfere with the operation of the primary circuit. Important product information is stored in the ROM cells such as manufacturer, mask set, and other manufacturer-related information, as well as key circuit parameters such as supply voltages, operating currents, programming voltages, programming pulsewidths and the like.

9 Claims, 4 Drawing Figures

|  | BYTE | Q8 (MSB) | Q7 | Q6 | Q5 | Q4 | Q3 | Q2 | Q1 (LSB) |
|---|---|---|---|---|---|---|---|---|---|
| COMPANY | $B_0$ | | | | | | | | |
| ALGORITHM NO. | $B_1$ | | | | | | | | |
| PROG. SUP. VOLTAGE | $B_2$ | | | | | | | | |
| SUPPLY V. MULTIPLIER | $B_3$ | | | | | | | | |
| PROG. P.W. | $B_4$ | | | | | | | | |
| PULSE WIDTH MULT. | $B_5$ | | | | | | | | |
| PROG. VERIFY VOLTAGE 1 | $B_6$ | | | | | | | | |
| VERIFY VOLTAGE 1 MULT. | $B_7$ | | | | | | | | |
| PROG. VER. V. 2 | $B_8$ | | | | | | | | |
| VER. V. 2 MULT. | $B_9$ | | | | | | | | |
| INPUT VOLT (VIH) | $B_{10}$ | | | | | | | | |
| INPUT VOLT (VIL) | $B_{11}$ | | | | | | | | |
| PROG. CURRENT (IPP) | $B_{12}$ | | | | | | | | |
| MASK REV. | $B_{13}$ | | | | | | | | |
| FAB NO. | $B_{14}$ | | | | | | | | |
| CHECK SUM | $B_{15}$ | | | | | | | | |

FIG. 4

METHOD AND DEVICE FOR ENCODING PRODUCT AND PROGRAMMING INFORMATION IN SEMICONDUCTORS

RELATED APPLICATION

The present application is a continuation-in-part of my prior copending patent application Ser. No. 301,592, now abandoned, filed Sept. 14, 1981 and entitled "Method And Device For Encoding Product And Programming Information In Semiconductors".

FIELD OF THE INVENTION

The present invention relates generally to semiconductor devices, and more particularly to methods and apparatus for identifying device characteristics in semiconductors.

BACKGROUND OF THE INVENTION

In the field of electronics, it has long been desirable to be able to identify pertinent information about particular semiconductor circuits, or chips. However, prior to the present invention, obtaining such pertinent and useful information as the identity of the manufacturer, the particular type of device, the mask set used in its manufacture, the fabrication process used, and so on, required a visual inspection of not only the outside casing in which the chip was packaged, but also often required an inspection of the actual semiconductor chip contained within the package.

Inspections of the package are frequently complicated by the presence of adjacent circuitry, lack of identifying marks on the package, coatings or other coverings placed over the chip to assure circuit integrity, and other reasons. Inspections of the chip itself were made difficult by all of the foregoing difficulties, plus the fact that the package was not intended to be removable, and thus such removal normally destroyed the device.

In addition to the information described above, it has also been difficult, but desirable, to ascertain key electrical parameters of the devices. In the past, this has generally been done by identifying the type of device and the manufacturer, and then referring to a sheet of specifications which describe such parameters. Although certain standards exist by which some of these parameters are somewhat predetermined, many devices of medium or high complexity, such as byte-wide memories, involve at least a few parameters which vary depending upon the type of device.

As a result, there has been a need for a method and device whereby product information, including device electrical parameters, could be determined without direct visual inspection of either the package or the chip itself.

SUMMARY OF THE INVENTION

The present invention provides an inexpensive and reliable solution of the foregoing problem, whereby substantial amounts of information regarding manufacturer and device parameters may be ascertained by electrically interrogating the semiconductor chip. More specifically, memory cells of the "read only" type, and containing the desired manufacturer and device information, are placed on the semiconductor chip adjacent that portion of the chip which performs the primary function of that circuit.

An enable/disable circuit is also included on the chip, and serves to disconnect the added ROM cells from the primary circuit during normal operation. Similarly, when the user desires to determine the manufacturer or other information stored in the ROM cells, a signal is provided to the enable/disable circuit which disconnects the primary circuit and permits access to the memory cells containing the desired information. In this manner the product information memory may be electrically connected to the same pins on the chip which provide electrical connection to the primary circuit.

It is one object of the present invention to provide an improved method of providing product information for semiconductor circuits.

It is another object of the present invention to provide an improved, inexpensive and reliable device for providing key electrical parameters of semiconductor circuits to the user.

It is still another object of the present invention to provide a device and method which permits a user to ascertain device characteristics of semiconductor circuits without a visual inspection.

It is yet another object of the invention to provide a device and method whereby product information for semiconductor circuits can be ascertained through electrical interrogation of the circuit.

These and other objects of the present invention can be better appreciated from the following detailed description of the invention, taken with reference to the appended figures, in which FIG. 1 is a schematic block diagram showing the present invention implemented on an exemplary semiconductor circuit such as a byte-wide memory, FIG. 2 is a schematic representation of an enable/disable circuit suitable for use with the present invention, FIG. 3 is a more detailed logic diagram of an enable/disable circuit suitable for use with the present invention, and FIG. 4 is table of device characteristics which may be included in the information stored in the product information memory of the present invention.

DETAILED DESCRIPTION OF THE INVENTION

Figure 1:
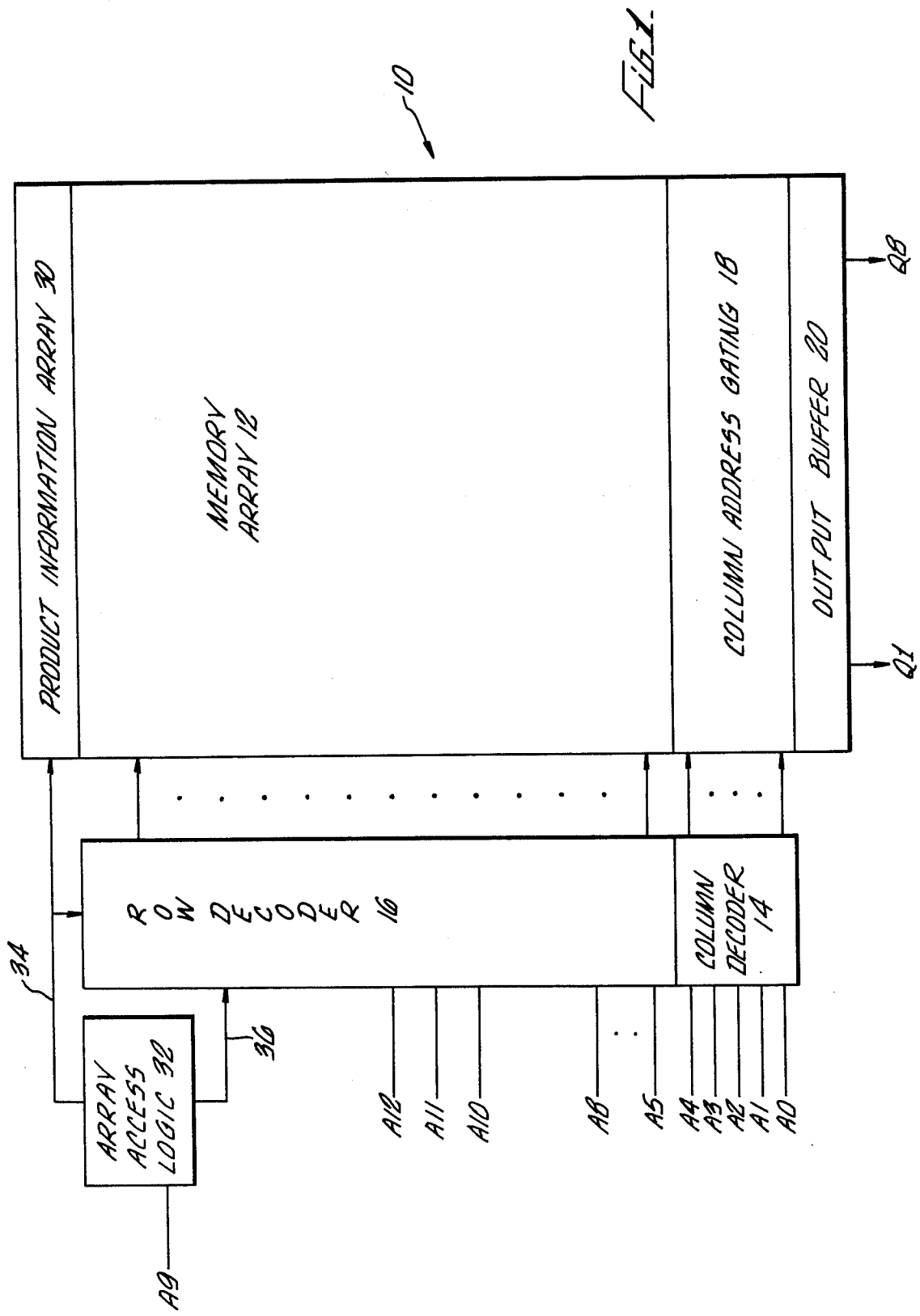

With reference to FIG. 1, there is shown therein an exemplary semiconductor circuit 10 with which the present invention can be effectively used. More particularly, the circuit 10 may be a device such as a 2564 erasable, programmable, read only memory (EPROM) such as manufactured by a number of semiconductor vendors. As is well known in the art, a 2564 EPROM stores 64k bits of digital information, arranged in a 256-by-256 bit array 12. Thus each row and each column contains 256 bits of information. As with many other memory devices, that information is organized into groups of bits, referred to as bytes, and simultaneous access is provided to those bits which comprise a selected byte of information. A byte typically comprises eight bits, and this format will be used for purposes of discussion of the present invention herein.

The access to the memory array referred to above is provided through column decoder 14, row decoder 16 and column address gating 18, with the output from the array being presented via an output buffer 20. The column decoder 14 and row decoder 16 are controlled by signals provided to their inputs via address pins A0 through A4 and A5 through A12, respectively. The output of the memory array 12 appears on output pins Q1 through Q8.

In accordance with the present invention, the memory array 12 has been modified to include a product information array 30. The product information array 30 is, for the exemplay device shown here, preferably arranged in the format of a single row, to permit byte access to the product information. However, it is also possible to incorporate the array 30 in the form of a plurality of rows, or in the format of one or more columns, as discussed in more detail hereinafter.

The array 30 is preferably of the diffusion masked ROM type, since this provides the greatest integrity to the information stored in the array. More specifically, since the information to be stored in diffusion masked ROM cells determines the circuit connections of the cell, and thus the mask set used for fabricating the cell, the information cannot be altered once the circuit has been manufactured, as well as making the information nonvolatile. In addition, diffusion masked ROM cells require the least amount of space, or "real estate", on the chip, employ the most reliable fabrication techniques, and are substantially completed during the early fabrication steps. (For devices such as the 2564, incorporation of the present invention in the form of one row of 256 mask ROM bits requires substantially less than one percent additional real estate.) However, it may be desirable in some instances to employ other types of memory cells, such as fusible link devices, EPROM cells, or $E^2$PROM cells for the array 30. It such instances it will be recognized that the data stored in the array is entered after fabrication of the chip, and thus is subject to the entry of human error.

It is necessary that the data stored in the product information array 30 not interfere with the normal operation of the primary circuit on the chip, i.e. the memory array 12 and associated decoders, gates and buffers. To ensure that undesirable interference does not occur, while at the same time permitting the existing pins to serve dual functions to access the memory array 12 and the information array 30 at the appropriate times, multiple level signals are applied to a selected row address pin. For purposes of this discussion, in which a 2564 device is exemplary, row address pin A9 has been selected to operate with dual functions. For devices of other sizes, it is preferable to use an address pin having the same location on the die as the pin A9, although such a pin in other devices may not be assigned the same nomenclature.

For conventional operation, conventional TTL signal levels are applied to pin A9. However, to access the information array 30, a high voltage signal such as fifteen volts is impressed upon the pin A9. To permit the circuitry to distinguish between the conventional TTL signals and the high voltage signal, array access logic 32 is provided as an interface between a row address pin A9 and the row decoder 16 and array 30. The pin A9 is thus connected to the access logic 32, which determines whether a high voltage signal is present.

If the signal on the pin A9 is of conventional levels, access to the product information array 30 is disabled by means of a signal on a line 34, and the row decoders 16 are conversely enabled thereby. The signal impressed on the pin A9 is also supplied to the row decoders 16 on a line 36. However, should the signal on the pin A9 be high voltage such as 15 volts, the logic 32 detects the high signal, disables the decoder 16 and at the same time addresses the array 30. Then, by conventional exercising of the address lines A0 through A4, byte-wide access to the information stored in the array 30 is provided, with the information appearing in a conventional manner on the output pins Q1 through Q8.

Figure 2:
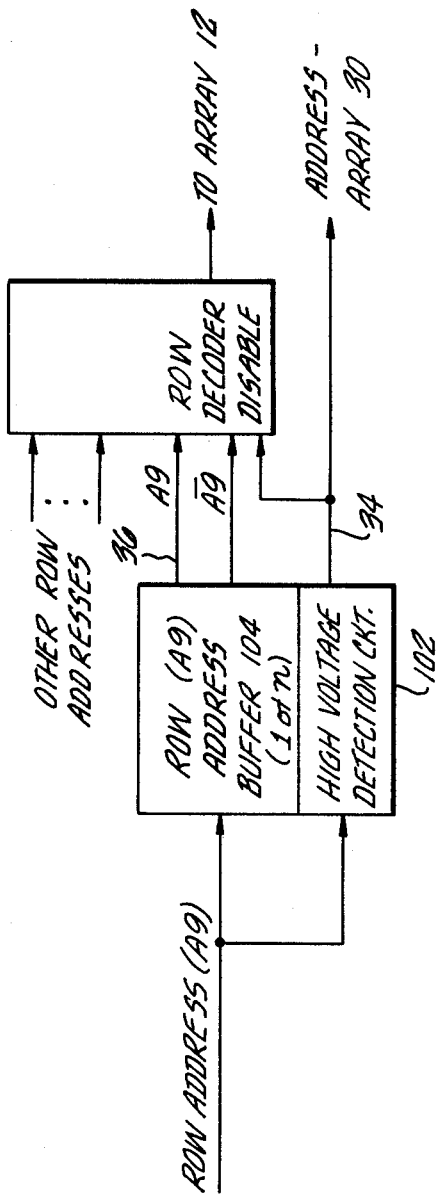

Referring next to FIG. 2, the array access logic 32 is shown in more detail, and can be seen to include a high voltage detection circuit 102 and a conventional single bit row address buffer 104 (only one of n shown). The buffer 104 is provided to convert the TTL input signals to MOS logic levels, and provides both true and complement outputs to the decoder 16. The high voltage detection circuit 102 provides an enable/disable signal on the line 34, as shown generally in FIG. 1.

Figure 3:
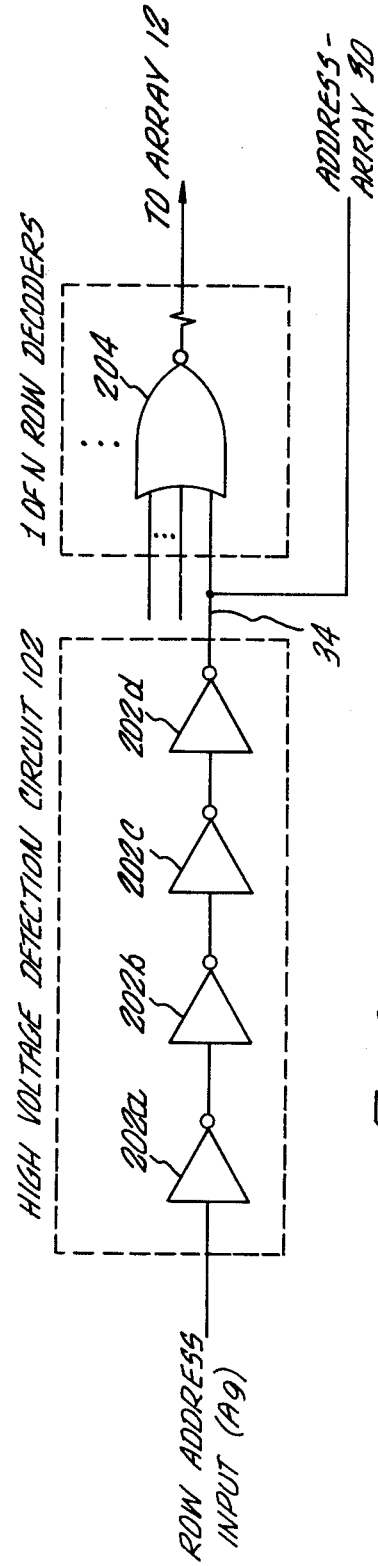

Referring further to FIG. 3, the high voltage detection circuit 102 may be comprised of a string of four inverters 202a through 202d, with the inverter 202a having a suitable threshold for detection of the high voltage signal involved. The signal is then restored to conventional TTL levels through the remaining inverters, such that the output of the inverter 202d may be supplied on the line 34 as a conventional TTL signal to the nor gates 204 (only one shown) which form the input stage of the row decoder 16. In this manner the high voltage signal on the pin A9 can be seen to cause the row decoder 16 to be disabled from conventional operation, while also addressing the information array 30 to provide the desired product information.

Referring further to FIG. 4, there is reflected therein exemplary information which may be included within the array 30. Those skilled in the art will recognize that only sixteen bytes are required for encoding of all of the information shown in FIG. 4, whereas an array 30 comprising a single row provides thirty-two eight bit bytes. As a result, sixteen additional bytes are provided for arbitrary use by the manufacturer. To provide for error detection, one byte of each block of sixteen bytes may be allocated for storage of a check sum In addition, those skilled in the art will recognize that eight bits are insufficient to spell the names of most semiconductor vendors, although only eight bits have been allotted in FIG. 4. In fact, however, the single byte allotted in FIG. 4 is sufficient to identify each semiconductor vendor if done in accordance with the following format. It is well known that the total number of semiconductor manufacturers, while on the rise, is presently less than thirty. By alphabetically listing these manufacturers, a decimal number beginning with one may be assigned, which converts to a short binary number. To allow for an increase in the number of manufacturers, seven bits may be used, with the eighth bit being a parity bit. New manufacturers would simply be added to the bottom of the list, which could be maintained by a trade association such as JEDEC.

An alternative approach also exists. By allowing bits Q1 through Q5 to designate one letter of a manufacturer's name, and by allowing bits Q6 through Q8 to designate which of the first seven letters of the vendor's name is represented by bits Q1 through Q5, up to 256 companies may be uniquely identified. To prevent a plurality of companies from selecting the same identification code (as, for example, where both company names begin with S), such identifying codes may be assigned, and a master file thereof maintained, by organizations such as JEDEC.

As noted previously, the present invention is particularly applicable to byte-wide memories such as RAMs, EPROMs and $E^2$PROMs, and is preferably implemented in a single row format. However, those skilled in the art, given the teachings herein, will appreciate that the present invention could easily be implemented as a column of cells. In such an instance, a column address would be selected as the address for the array 30, and the information stored in the array 30 would be red out in serial fashion by conventional exercising of the row decoders 16.

It will likewise be appreciated that, while the present invention is particularly useful on devices of large die sizes, since little additional real estate is required, the present invention is also useful in ensuring consistency for circuits of smaller die sizes. Thus, for example, in some instances semiconductor users have applications where changes in product geometries, electrical parameters, mask sets or other characteristics may have substantial impact upon the suitability of the component for the user's task. However, prior to the present invention, reporting of such changes to the user has not always been complete. With the present invention, such changes may be more readily reported since the product information array 30 is also part of the mask set. Thus, where reporting of such product changes is important, the present invention is also useful with small devices.

Although the pins selected for accessing the array 30 of the exemplary device described in detail above were also conventional input and output pins, other pins may also be suitable for such dual functioning. Thus any pin whose primary function is such that it need not function at the voltage levels chosen for the selection of the array 30 is suitable, subject to the geometries of the die. Likewise any pins which may receive information from the array 30 without adversely affecting the operation of the primary circuit are suitable for use and output pins for the array 30. While an especially high voltage has been discussed as exemplary for selecting the array 30, it will be appreciated that any other signal which is sufficiently outside the normal range of operating voltages for the primary circuit will be acceptable.

While the foregoing has described in detail one embodiment of the present invention, it will be appreciated that, given the teachings herein, numerous equivalents and alternatives which do not depart from the invention will be apparent to those skilled in the art, and those alternatives and equivalents are intended to be encompassed within the scope of the appended claims.

What is claimed is:

1. A device for providing semiconductor product information to a user through electrical interrogation comprising
    a primary circuit disposed upon a semiconductor chip,
    a product information array disposed on the semiconductor chip adjacent said primary circuit, said product information array including information sufficient to identify at least the manufacturer of the chip,
    access means for receiving first and second signals and for selecting said primary circuit in response to said first signal, said access means including a logic circuit means responsive to said second signal for selecting said product information array while simultaneously preventing access to said primary circuit,
    output means for providing output signals representative of the information stored in said product information array.

2. A device as set forth in claim 1, wherein said primary circuit is a semiconductor memory having a first portion arranged to provide a primary memory array and a second portion arranged to define said product information array.

3. A device as set forth in claim 2, wherein said access means further includes an address pin with a decoder means connected thereto for addressing a predetermined location in said primary memory array when said first signal is applied to said address pin.

4. A device as set forth in claim 3, wherein said logic circuit means is also connected to said address pin such that said product information array is selected by said logic circuit means when said second signal is applied to said address pin.

5. A device as set forth in claim 4, wherein said first and second signals have respectively different signal levels and said logic circuit means includes a detector means which distinguishes between the levels of said first and second signals in order to select said product information array when said second signal is applied to said address pin.

6. A device as set forth in claim 5, wherein said first signal is characterized by a TTL voltage level, said second signal is characterized by a high voltage level relative to said first signal, and said detector means comprises a high voltage detection circuit which generates a TTL-level control signal when said second signal is applied to said address pin.

7. A device as set forth in claim 6, wherein said decoder means in said access means includes a disabling means connected to receive said control signal from said high voltage detection circuit for disabling said decoder means to prevent said decoder means from addressing said primary memory array when said second signal is applied to said address pin.

8. A device as set forth in claim 7, wherein said high voltage detection circuit includes a plurality of inverters.

9. A method of encoding product information on semiconductor devices including at least identification of the manufacture of the semiconductor device comprising the steps of
    providing a nonvolatile storage means on the device adjacent a primary circuit,
    encoding in the storage means selected semiconductor product information including at least identification of the manufacturer, and
    providing access means to permit access to said primary circuit during a firt interval and to permit the encoded information to be retrieved from the storage means while simultaneously preventing access to said primary circuit during a second interval.

* * * * *

UNITED STATES PATENT AND TRADEMARK OFFICE
Certificate

Patent No. 4,451,903                                                                    Patented: May 29, 1984

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Larry T. Jordan and Anil Gupta.

Signed and Sealed this Sixth Day of October, 1998.

BRIAN W. BROWN
*Special Program Examiner*
Technology Center 2800